(12) United States Patent
Smith

(10) Patent No.: US 6,611,237 B2
(45) Date of Patent: Aug. 26, 2003

(54) FLUIDIC SELF-ASSEMBLY OF ACTIVE ANTENNA

(75) Inventor: John Stephen Smith, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 7 days.

(21) Appl. No.: 09/727,647

(22) Filed: Nov. 30, 2000

(65) Prior Publication Data

US 2002/0093396 A1 Jul. 18, 2002

(51) Int. Cl.[7] .............................................. H01Q 13/00
(52) U.S. Cl. ....................................... 343/772; 333/157
(58) Field of Search .......................... 343/700 MS, 772;
333/108, 113, 114, 122, 128, 156, 157,
159, 248, 161; 342/368–372; 438/106,
107, 108, 109; 257/686, 688; H01Q 13/00

(56) References Cited

U.S. PATENT DOCUMENTS

| | | | | |
|---|---|---|---|---|
| 4,379,307 A | * | 4/1983 | Soclof ........................... 357/68 |
| 4,626,865 A | * | 12/1986 | Rammos ...................... 343/786 |
| 4,888,597 A | * | 12/1989 | Rebiez et al. ................ 343/778 |
| 4,994,813 A | | 2/1991 | Shiramatsu et al. ......... 342/360 |
| 5,166,693 A | | 11/1992 | Nishikawa et al. .......... 342/422 |
| 5,212,463 A | * | 5/1993 | Babbitt et al. ............... 333/161 |
| 5,222,162 A | | 6/1993 | Yap et al. ...................... 385/14 |
| 5,294,934 A | | 3/1994 | Matsumoto ................... 342/173 |
| 5,404,148 A | | 4/1995 | Zwarts ......................... 343/776 |
| 5,414,434 A | | 5/1995 | Conant et al. ........ 343/700 MS |
| 5,434,581 A | * | 7/1995 | Raguenet et al. .... 343/700 MS |
| 5,545,291 A | | 8/1996 | Smith et al. .............. 156/655.1 |
| 5,561,434 A | | 10/1996 | Yamazaki ............ 343/700 MS |
| 5,589,834 A | | 12/1996 | Weinberg .................... 342/354 |
| 5,694,134 A | | 12/1997 | Barnes ........................ 343/700 |
| 5,783,856 A | | 7/1998 | Smith et al. .................. 257/618 |
| 5,793,330 A | | 8/1998 | Gans et al. .......... 343/700 MS |
| 5,824,186 A | | 10/1998 | Smith et al. .............. 156/655.1 |
| 5,886,671 A | | 3/1999 | Riemer et al. ............... 343/776 |
| 5,904,545 A | | 5/1999 | Smith et al. ................. 438/455 |
| 5,986,590 A | | 11/1999 | Smith et al. ................... 341/70 |
| 6,016,122 A | | 1/2000 | Malone et al. .............. 342/372 |
| 6,061,026 A | | 5/2000 | Ochi et al. ........... 343/700 MS |
| 6,094,170 A | | 7/2000 | Peng .................... 343/700 MS |
| 6,136,278 A | * | 10/2000 | Eliasson et al. ........ 422/186.04 |
| 6,281,038 B1 | * | 8/2001 | Jacobsen et al. ............. 438/106 |
| 6,281,844 B1 | | 8/2001 | Kodim et al. ........ 343/700 MS |
| 6,285,325 B1 | | 9/2001 | Nalbandian et al. . 343/700 MS |
| 6,291,896 B1 | * | 9/2001 | Smith .......................... 257/693 |
| 6,304,232 B1 | | 10/2001 | Brown et al. ................ 343/895 |
| 6,320,543 B1 | * | 11/2001 | Ohata et al. ......... 343/700 MS |
| 6,386,251 B1 | * | 5/2002 | Koch et al. ............... 152/152.1 |

OTHER PUBLICATIONS

Alien Technology Corporation White Paper, "Fluidic Self Assembly", Oct. 1999.
Alien Technology Corporation Company Backgrounder, May 2000.

(List continued on next page.)

*Primary Examiner*—Don Wong
*Assistant Examiner*—Trinh Vo Dinh
(74) *Attorney, Agent, or Firm*—Pennie & Edmonds LLP

(57) ABSTRACT

Fluidic self-assembly of active antenna. An embodiment that is described in the specification and drawings include a strip of substrate material having an antenna on one side, signal and power busses on the other side, and one or more channel laid out across the strip of substrate material from the antenna to the signal and power busses. The strip of substrate material may have a number of recessed regions and shaped blocks disposed in the recessed regions via a fluidic self-assembly process. The shaped blocks may include micro-switches, CMOS control circuitry, and III–V semiconductor amplifiers. The strip may then be stacked together vertically with spacers to form a two dimensional phased-array.

74 Claims, 14 Drawing Sheets

OTHER PUBLICATIONS

Alien Technology Corporation, "Product Applications", *www.alientechnology.com./d/product/index.html*, (publication date unknown).

Alien Technology Corporation, "Overview", *www.alientechnology.com/technology/overview.html*, (publication date unknown).

Alien Technology Corporation, "Our Technology", *www.alientechnology.com/technology/index.html*, (publication date unknown).

Alien Technology Corporation, "PDF Library", *www.alientechnology.com/technology/index.html*, (publication date unknown).

Peng, Master of Science, Plan II: "Design of a 10,000-Element Quasi-Optical Grid Amplifier Assembled with Fluidic Self-Assembly" University of California, Berkeley, Engineering Library, 25 pages (Jun. 5, 1998).

* cited by examiner

FLUIDIC SELF-ASSEMBLY OF ACTIVE ANTENNA

BACKGROUND OF THE INVENTION

The present invention relates generally to active antennas and methods of fabricating the same.

Phased-array antennas are capable of controlling the emission of electromagnetic information. A typical conventional phased-array antenna has an arrangement of radiating elements where the relative phase of radio frequency waves propagated through each radiating element can be controlled to steer the "beam" of the antenna's radiation pattern. Because of this beam-steering capability, phased-array antennas have been widely used in sophisticated radar systems.

Recently, phased-array antennas have drawn much attention and interest in the wireless communication area. Conventional wireless systems are limited because all the data channels in a cell or reception area must share the frequency bandwidth that is available. This limit can be greatly increased by using phased-array antennas, or by using schemes such as the BLAST™ architecture from Lucent Technology, Inc.

Despite their superior capabilities, phased-array antenna systems have not been widely deployed for wireless communications because they often cost tens of millions of dollars. The hardware necessary to implement a phased-array antenna includes not only the antennas themselves. In one type of phased-array antenna, known as active arrays, each radiating element has associated electronics that include amplifiers and phase shifters. For transmission, amplifiers and phase shifters are needed for driving high frequency phased signals to each of the antenna elements. For reception, amplifiers and phase shifters are needed for phase-controlling and combining the received signal from each antenna element. The amplifiers, phase shifters and the driving circuitry are generally very complex and expensive.

SUMMARY OF THE DISCLOSURE

An embodiment of the present invention is an active antenna that includes a substrate strip having an antenna element along one side of the strip, signal and power busses along another side, and one or more channel laid out across the strip of substrate material from the antenna element to the signal and power busses. The strip of substrate material may have a number of recessed regions and a number of shaped blocks disposed therein by a fluidic self-assembly process. The shaped blocks may include electronic devices such as micro-switches, CMOS control circuitry, and III–V semiconductor amplifiers. A two-dimensional phased-array antenna structure may be formed by stacking multiple substrate strips together.

Another embodiment of the present invention is a method of fabricating an active antenna using fluidic self-assembly techniques. In this embodiment, the method includes micromachining shaped blocks containing electronic devices (e.g., micro-switches, CMOS control circuitry, and III–V semiconductor amplifiers, etc.), and forming recessed regions with matching profiles on a surface of a substrate. The surface is then treated to control surface forces, and the shaped blocks are dispensed on the surface in a liquid slurry. The shaped blocks self-align and fall into the matching recessing regions, forming a substantially planar assembly. Metalization and photolithography may then be applied to form signal and power busses, antenna elements, and waveguides on the substrate. Metalized lines for interconnecting the electronic devices to the waveguides, the signal busses, the power busses, and/or the antenna elements may also be formed. The method may further include stacking multiple substrates together to form a two dimensional phased-array antenna structure.

BRIEF DESCRIPTION OF THE DRAWINGS

For a better understanding of the invention, reference should be made to the following detailed description taken in conjunction with the accompanying drawings, in which.

DETAILED DESCRIPTION OF THE PREFERRED EMBODIMENTS

An embodiment of the present invention is a high performance, low cost phased-array antenna that includes electronic devices directly integrated therein using fluidic self-assembly techniques. Using fluidic self-assembly techniques, high performance electronic devices can be made from very small areas of a wafer and then directly integrated into a substrate on which an active antenna may be formed. Additionally, fluidic self-assembly techniques allow separate processing of heterogenous electronic devices. As a result, fabrication costs of phased-array antennas can be significantly reduced.

Overview of Fluidic Self-Assembly

A brief description of a fluidic self-assembly process that may be used to fabricate embodiments of the present invention follows. The single chip capabilities of silicon devices, particularly CMOS (Complementary Metal Oxide Semiconductor) devices, have been rising significantly, and are likely to continue to increase for at least the next decade. However, there are applications that demand capabilities beyond those silicon devices can provide. Those applications include high performance communications links, high frequency wireless communications, micro-electromechanical sensors, opto-electronic devices for optical communications, etc. Non-silicon devices capable of meeting such demands are therefore used in such applications. But non-silicon devices may have to be interconnected or integrated with silicon devices to form complete systems. Conventionally, non-silicon devices are integrated with silicon devices using ball bumps or ribbon bonds. Those conventional approaches, however, are less than ideal because the parasitics of ball bumps or ribbon bonds may limit the performance of such integrated systems. Additionally, those conventional approaches, which generally require highly optimized robotic pick-and-place and wire bonding of electronic devices, are not cost effective.

Figure 1:
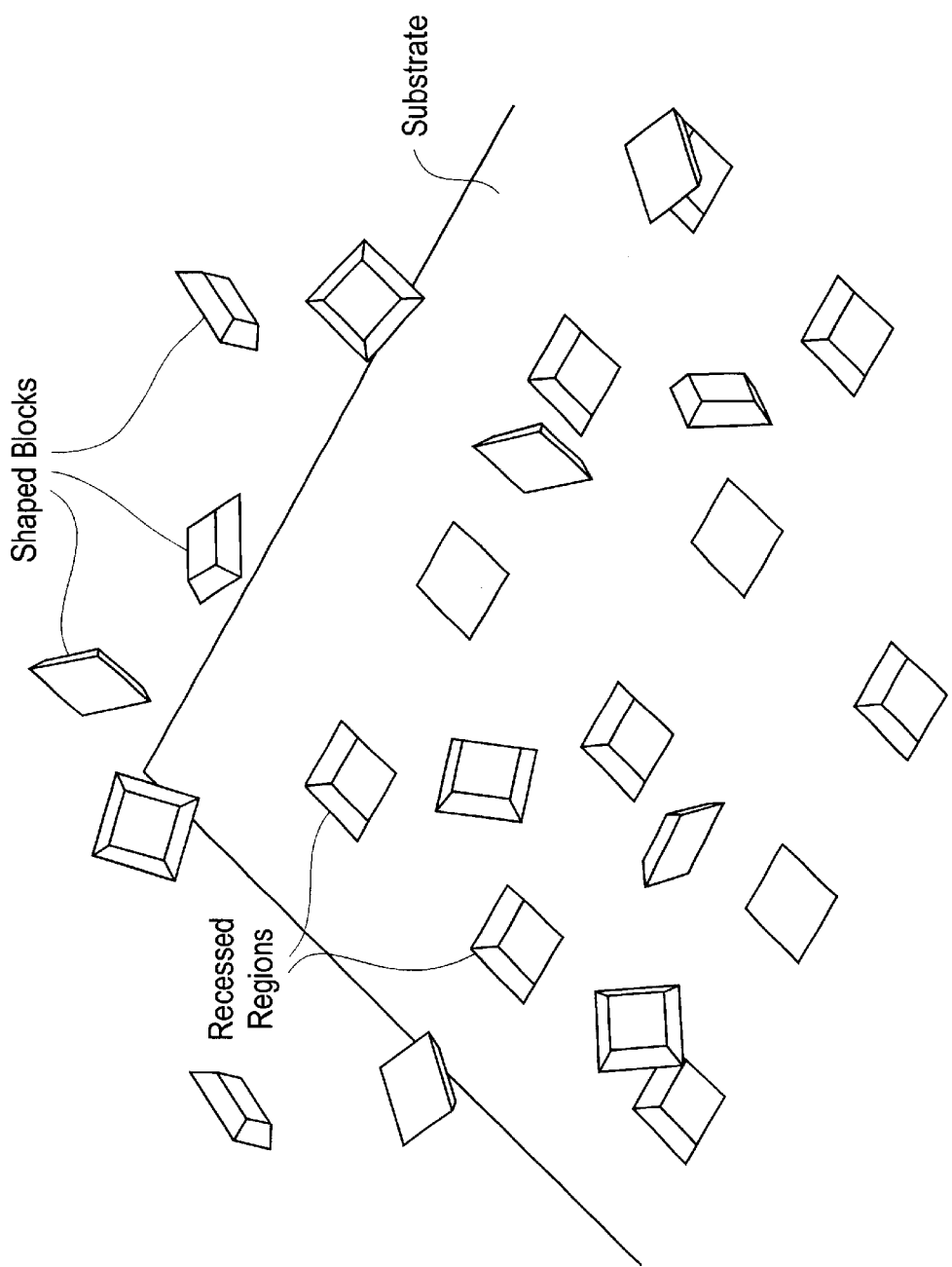
FIG. 1 depicts an exemplary fluidic self-assembly process that may be performed according to embodiments of the present invention.

Fluidic self-assembly, which is a massively parallel stochastic assembly process where random motions are harnessed to assemble thousands to millions of components in parallel, overcomes the problems faced by ball bumps or ribbon bonds. Generally, fluidic self-assembly starts with forming electronic devices on a wafer, micro-machining shaped blocks that contain the electronic devices, and forming recessed regions on a surface of a substrate. The surface of the substrate is treated to control surface forces, and the shaped blocks are transported in a liquid slurry. In the assembly process, the liquid slurry is dispensed or circulated over the substrate. Shaped blocks matching the profile of the recessed regions self-align and become engaged therein to form a substantially planar assembly. An exemplary fluidic self-assembly process is depicted in FIG. 1. Metalization and photolithography may then be used to interconnect the devices.

Using fluidic self-assembly techniques, high performance electronic devices of an active antenna may be fabricated as shaped blocks using III–V semiconductors (e.g., GaAs, InP, etc.). The high performance electronic devices can thus be easily integrated with CMOS devices, such as CMOS control circuitry, without the parasitic problems of prior art approaches.

In addition, fluidic self-assembly techniques may be used to integrate micro-electromechanical system (MEMS) devices with CMOS devices and/or III–v semiconductor devices in an active antenna. Although MEMS devices are typically fabricated on silicon substrates, the process steps for fabricating MEMS devices and those for fabricating the accompanying electronic circuits are often vastly different and incompatible. Fluidic self-assembly techniques thus allow separate processing of MEMS devices, CMOS devices, and III–V semiconductor devices, while providing low parasitic interconnections in the resultant assemblies.

Fluidic Self-Assembly of Active Antennas

Figure 2:
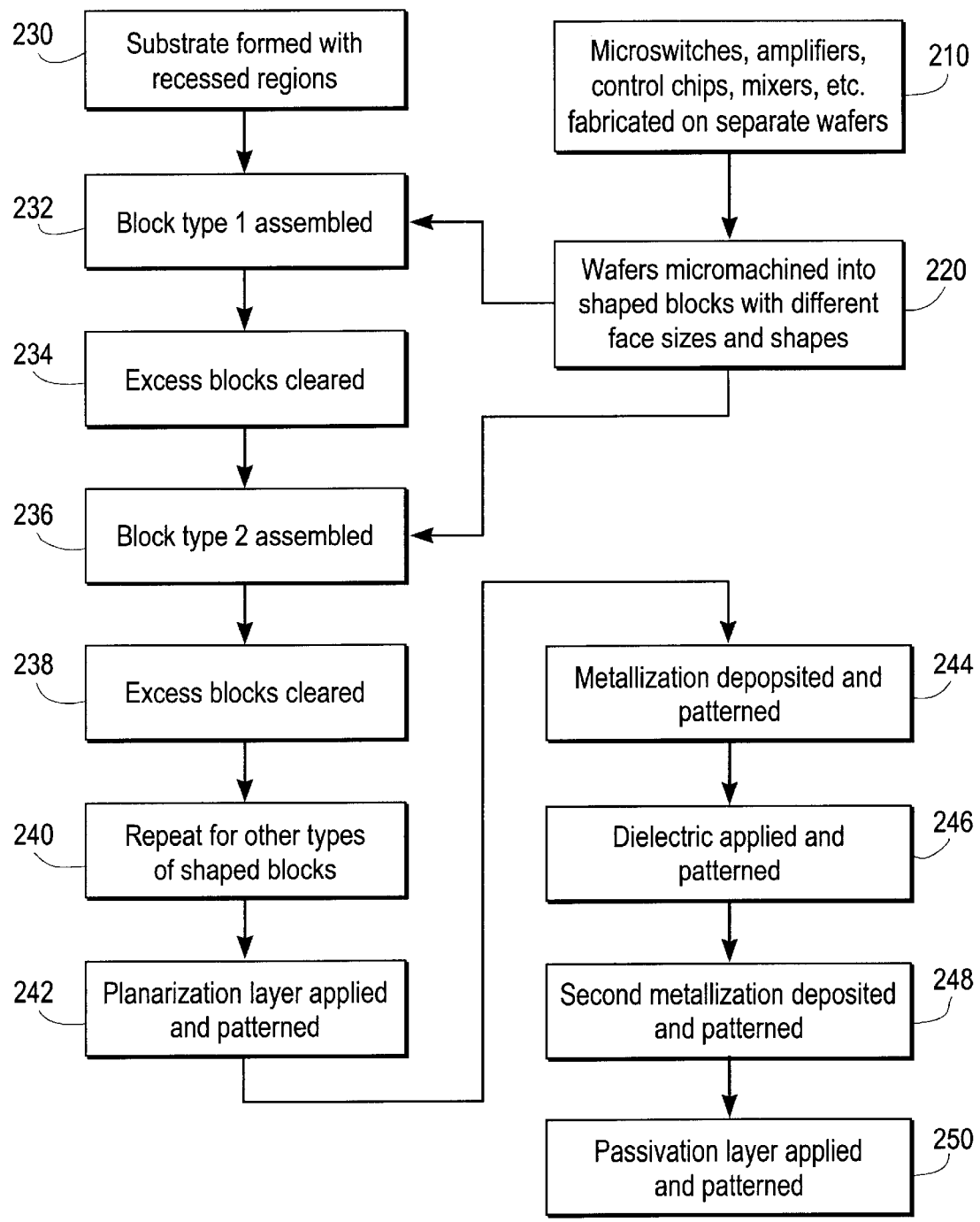
FIG. 2 illustrates a method of fabricating active antennas using fluidic self-assembly techniques in accordance with an embodiment of the present invention.

The present invention provides a method of fabricating active antennas using fluidic self-assembly techniques, an embodiment of which is illustrated in FIG. 2. As shown, the method of the present embodiment includes fabrication of electronic devices (e.g., micro-switches, amplifiers, control circuits, mixers, etc.) on separate wafers (step 210). According to the present embodiment, the electronic devices may be fabricated using well known semiconductor processing techniques and processes. For example, micro-switches may be fabricated using standard MEMS processes, while the control circuits may be fabricated using standard CMOS processes. Amplifiers, mixers, etc., may be fabricated using III–V semiconductor wafers such as GaAs.

After the micro-switches, control circuits, amplifiers, mixers, etc., are fabricated, the wafers containing the devices are micro-machined into shaped blocks of different face shapes and/or sizes (step 220). For example, the wafers containing the micro-switches may be micro-machined into trapezoidal blocks having square faces, the wafers containing the control circuits may be micro-machined into trapezoidal blocks having rectangular faces, and the wafers containing the amplifiers may be micro-machined into trapezoidal blocks having rectangular faces larger than those of the micro-switches. According to the present embodiment, the face shapes may include asymmetrical features, such as bumps or notches, such that the shaped blocks will be disposed into appropriate recessed regions of a substrate in a proper orientation in subsequent assembly steps. Note that a shaped block may include one or more devices.

Mechanisms for micro-machining shaped blocks are well known in the fluidic self-assembly art. An exemplary method and apparatus for fabricating shaped blocks may be found in U.S. Pat. No. 5,824,186, which is entitled "Method and Apparatus for Fabricating Self-Assembling Microstructures," by John Stephen Smith et al., and assigned to the Regents of University of California.

With reference again to FIG. 2, at step 230, recessed regions are formed on a surface of a substrate. The recessed regions of the present example may have profiles that are complementary to the shaped blocks. According to the present embodiment, the substrate may be a plastic material (e.g, nylon acrylic (Lucite, Plexiglass, etc.), polystyrene (e.g., rexolite), polycarbinate (e.g., Lexan), polyamide, teflon, etc.), and/or non-plastic dielectrics such as alumina, beryllia, ceramic, fused quartz, gallium arsenide (semi-insulating), silicon, glass, glazed ceramic, porcelain, titania, etc. Many other types of materials are also appropriate. Generally, low loss tangent, deformability, and ease of shaping and bonding are desirable properties of the substrate.

Figure 3A:
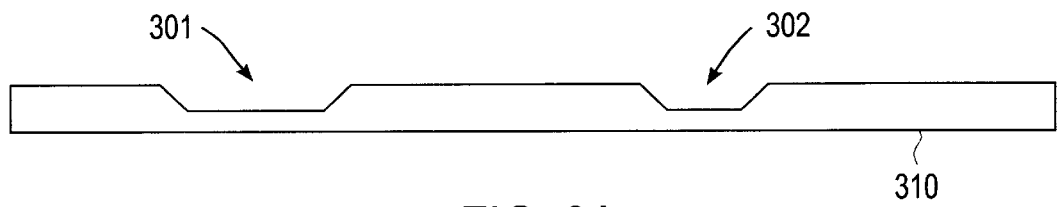
FIGS. 3A–3J are simplified cross-sectional view illustrating steps of the active antenna fabrication method of FIG. 2 in accordance with one embodiment of the present invention.

Mechanisms for forming recessed regions in a substrate are well known in the fluidic self-assembly art. The recessed regions may be formed by wet etching, plasma etching, reactive ion etching, ion milling, stamping, molding, casting, etc. Many other processes for creating recessed regions on a surface of a material may also be used. An exemplary method and apparatus for forming recessed regions in a substrate may also be found in U.S. Pat. No. 5,824,186. A simplified cross-sectional view of a substrate 310 with recessed regions 301, 302 formed thereon for receiving shaped blocks is illustrated in FIG. 3A.

With reference again to FIG. 2, at step 232, one type of the shaped blocks (e.g., shaped blocks that contain the control circuits) are disposed into the recessed regions having matching profiles using fluidic self-assembly techniques. According to the present example, fluidic self-assembly is achieved by dispensing a slurry that contains a liquid and the shaped blocks onto the substrate. Generally, the slurry is distributed or circulated over the substrate at a rate that allows suspended blocks to be properly orientated to the recessed regions without causing blocks already disposed from popping out. After the recessed regions are filled, excess shaped blocks are cleared (step 234).

Figure 3B:
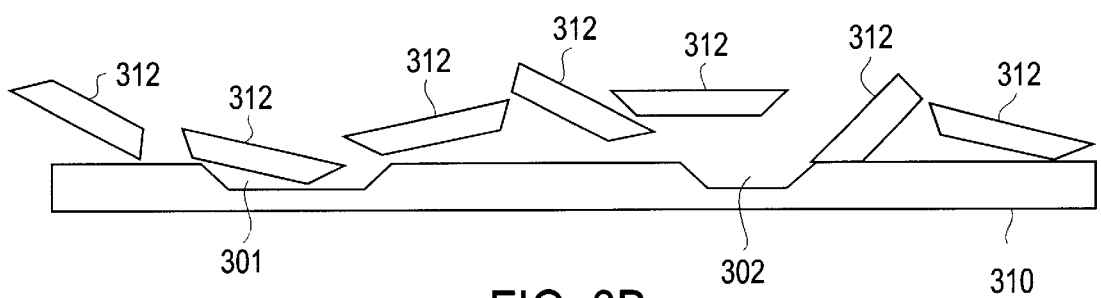

FIG. 3B is a simplified cross-sectional view illustrating step 232. As shown in FIG. 3B, shaped blocks 312 are dispensed on the surface of a substrate 310 having recessed regions 301, 302. Note that shaped blocks 312 have a profile that matches the recessed region 301, but are larger than the recessed region 302. According to the present embodiment, larger blocks are assembled before smaller ones so that the smaller blocks will not be disposed in the larger sites.

With reference again to FIG. 2, at step 236, a second type of the shaped blocks (e.g., shaped blocks that contain micro-switches) are disposed into the recessed regions having matching profiles using fluidic self-assembly techniques. Similar to step 232, a slurry containing a liquid and the second type of shaped blocks is distributed or circulated over the substrate. After the recessed regions for the second type of shaped blocks are filled, excess shaped blocks are cleared (step 238).

Figure 3C:
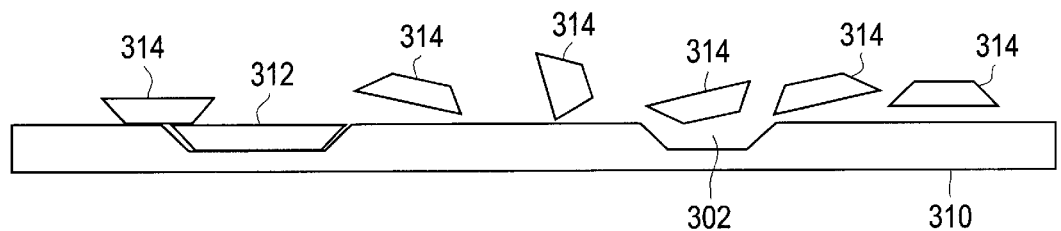
Figure 3D:
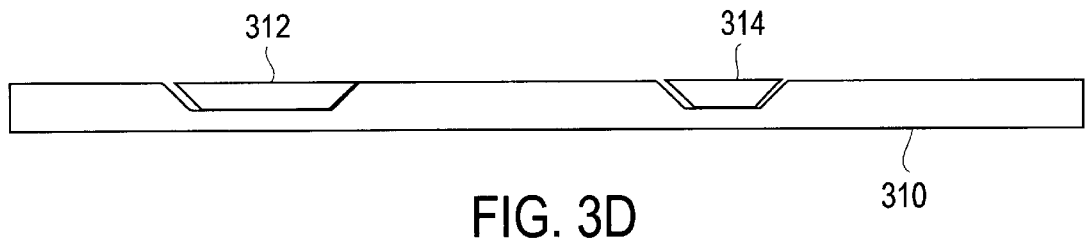

FIG. 3C is a simplified cross-sectional view illustrating the step 236 and showing a shaped block 314 being disposed into recessed region 302. FIG. 3D is a simplified cross-sectional view illustrating two shaped blocks 312, 314 disposed in the recessed regions of the substrate 310. It should be noted that, in FIGS. 3A–3D, the shaped blocks 312, 314 have similar side-wall angles despite their differences in size. Further, as shown in FIGS. 3A–3D, the shaped blocks 312, 314 have a similar thickness. It should also be noted, however, that the side-wall angles and the block thickness as shown are for illustrative purposes only and that the side-wall angles and block thickness may vary.

With reference again to FIG. 2, at step 240, other types of shaped blocks fabricated at step 220 are disposed into the appropriate recessed regions of the substrate using fluidic self-assembly techniques. In accordance with the present embodiment, larger blocks are placed before smaller ones to avoid misplacing the smaller shaped blocks in the larger recessed regions.

Figure 3E:
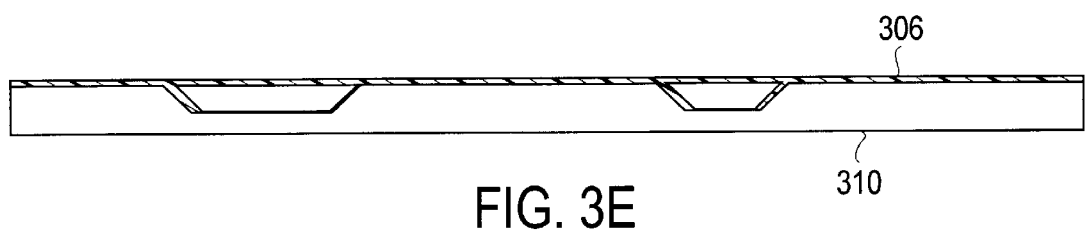
Figure 3F:
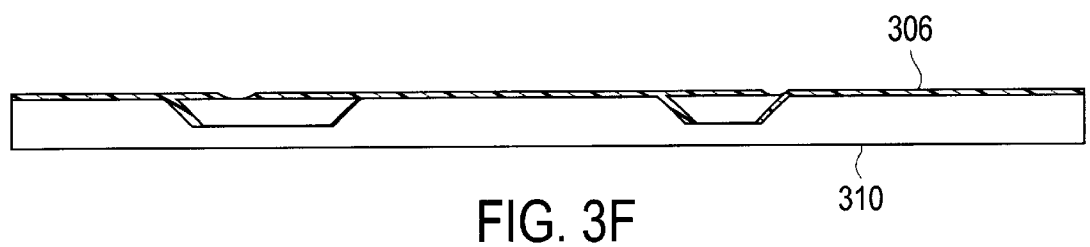

Then, at step 242, planarization material is applied and patterned. The planarization material encapsulates the shaped blocks and flattens the surface so that the metalization layer can be applied without disruption at the edges of the shaped blocks. FIG. 3E is a simplified cross-sectional view of the substrate 310 with shaped blocks 301 and 302 assembled, and planarization material 306 encapsulating the shaped blocks 312, 314 and providing a flat surface for metalization and photolithography. FIG. 3F is a cross-sectional view of the substrate 310 after the planarization material 306 is patterned.

Figure 3G:
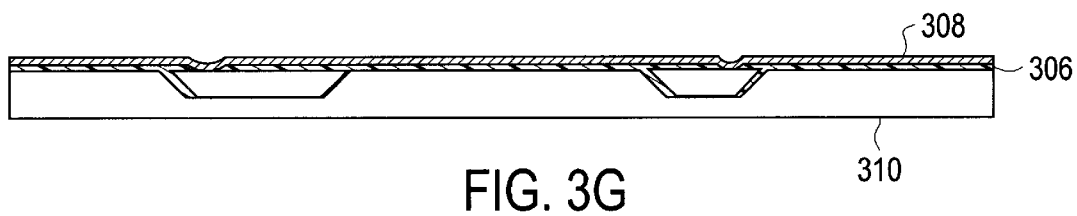

With reference again to FIG. 2, at step 244, a metal or conductive layer is then deposited and patterned. According to one embodiment of the present invention, waveguides of a phase shifter may be patterned at step 244. FIG. 3G illustrates the step 244 and shows a cross-sectional view of the substrate 310 after a conductive layer 308 is deposited and patterned.

With reference yet again to FIG. 2, a layer of dielectric is then applied and patterned at step 246. A second metal layer or conductive layer is then deposited and patterned at step 248. According to one embodiment, the second metal layer or conductive layer may be patterned to form control signal lines that interconnect CMOS control circuitry of an active antenna to a phase shifter or to amplifiers. At step 250, a passivation layer is applied and patterned.

Figure 3H:
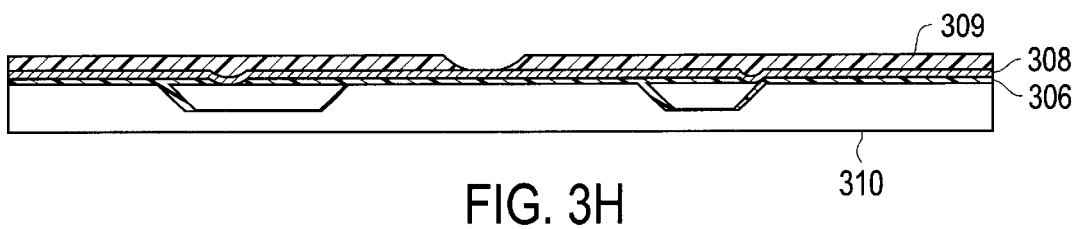
Figure 3I:
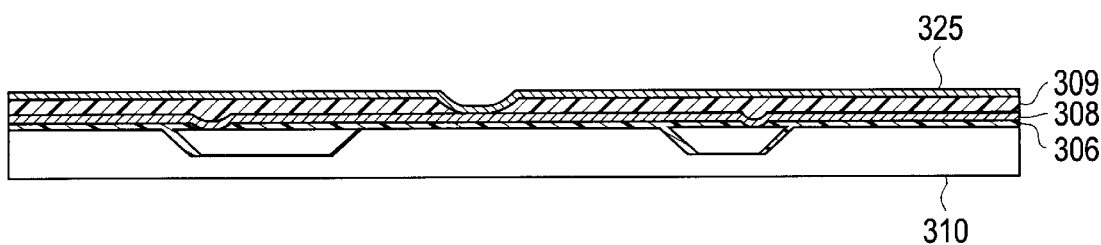
Figure 3J:
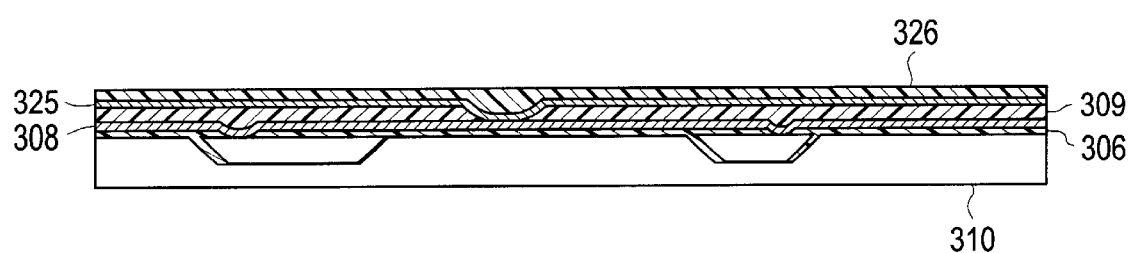

FIG. 3H is a cross-sectional view of the substrate 310 after a dielectric layer 309 is deposited and patterned. FIG. 3I is a cross-sectional view of the substrate 310 after a second metal layer 325 is deposited and patterned. FIG. 3J is a cross-sectional view of substrate 310 after a passivation layer 326 is deposited.

Active Antennas Assembled Using Fluidic Self-Assembly Techniques

Figure 4A:
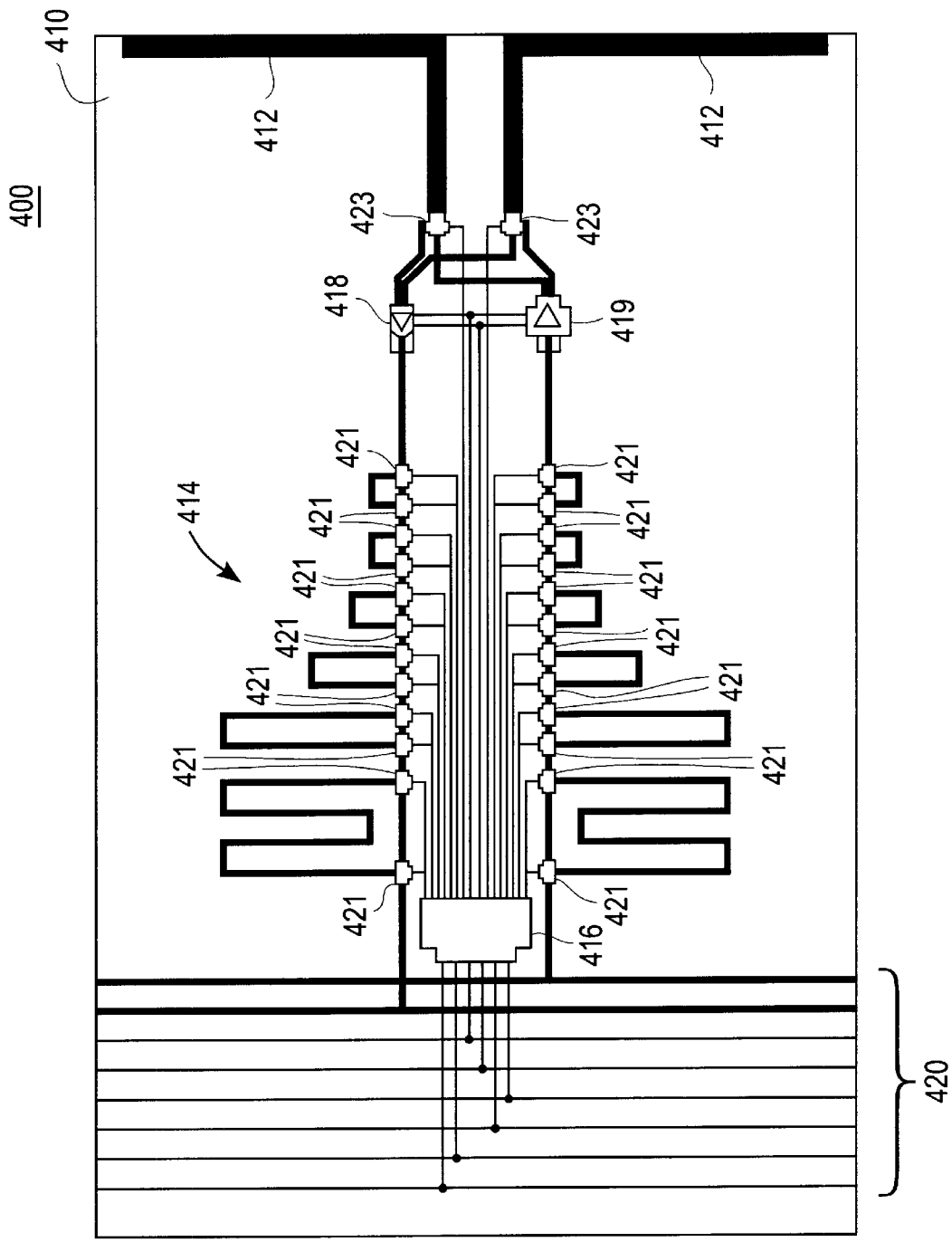
FIG. 4A is a top plan view of an active antenna assembled using fluidic self-assembly techniques according to one embodiment of the present invention.

FIG. 4A is a top plan view of an active antenna 400 according to one embodiment of the present invention. As shown, the active antenna 400 includes antenna elements 412, a phase shifter 414 having meandering waveguides interconnected by MEMS switches 421, CMOS control circuitry 416, III–V amplifiers 418, 419, and multiplexers 423 for controlling input and output of the antennas. Also illustrated are signal and power busses 420. The phase shifter 414 is also coupled to receive signals from and transmit signals to signal and power busses 420. In the illustrated embodiments, signals and power are carried on different transmission lines on the signal and power busses 420. In another embodiment of the present invention, DC power and ground and AC signals may be superimposed and carried by a same transmission line.

According to the present embodiment, the electronic devices of the antenna 400 (e.g., CMOS control circuitry 416, the III–V amplifiers 418, 419, micro-switches 421, and multiplexers 423) may be fabricated on separate wafers, micro-machined into shaped blocks, and disposed into micro-machined recessed regions of the substrate 410 using fluidic self-assembly techniques. Further, according to the present embodiment, the signal transmission lines of the phase shifter 414, and the signal and power busses 420, may be deposited and patterned after the active elements are disposed in the recessed regions of the substrate 410.

In operation, the CMOS control circuitry 416 receives control signals from the busses 420, and, in response to the control signals, adjusts the phases of signals transmitted between the busses 420 and the antenna elements 412 by selectively opening and closing the MEMS switches 421. Transmission paths of various lengths can be formed by selective opening and closing of the MEMS switches 421. For example, for a larger phase shift, the MEMS switches 421 may be selectively opened and closed such that signals propagate along a larger number of the meandering waveguides. Similarly, for a smaller phase shift, the MEMS switches 421 may be selectively opened and closed such that signals propagate along fewer of the meandering waveguides. Phase shifters and other apparatus for phase shifting signals similar to the phase shifter 414 may also be called waveguide networks, or time-delay networks. In other embodiments of the present invention, the phase shifter may not use MEMS switches for adjusting its delay. Rather, many other electronic devices, such as Microwave Field Effect Transistors, microwave bipolar transistors, or PIN diodes, etc., may be used.

It should also be noted that the phase shifter 414 of the illustrated embodiment includes micro-strip type waveguides. Micro-strip type waveguides of the present embodiment may require a conductive ground plane (which may be formed on the bottom surface of the substrate 410) and vias punched through the substrate 410 to connect to the ground plane. Further, the signal transmission lines of the bus 420 are also of a micro-strip type and may require a conductive ground plane. Micro-strip type waveguides may not be ideal for a phased-array antenna. Other types of waveguides, such as co-planar waveguides, may be used. Micro-strip waveguides and co-planar waveguides will be discussed in greater detail below.

With reference still to FIG. 4A, the high performance III–V amplifier 418, 419 may be a low noise input amplifier made of GaAs or indium phosphate (InP). The amplifier 418 amplifies signals received from the antenna elements 412, and provides the amplified signals to the phase shifter 414. The amplifier 419 receives phase-shifted signals from the phase shifter 414, and amplifies the phase-shifted signals to be transmitted via antenna elements 412.

An advantage of the active antenna of the present embodiment is that many different types of substrates can be used. According to the present embodiment, the substrate may be plastic (e.g, nylon acrylic (e.g., Lucite, Plexiglass), polystyrene (e.g., rexolite), polycarbinate (e.g., Lexan), polyamide, teflon, etc.), and/or non-plastic dielectrics such as alumina, beryllia, ceramic, fused quartz, gallium arsenide (semi-insulating), silicon, glass, glazed ceramic, porcelain, titania, etc. Many other types of materials are also appropriate.

Figure 10:
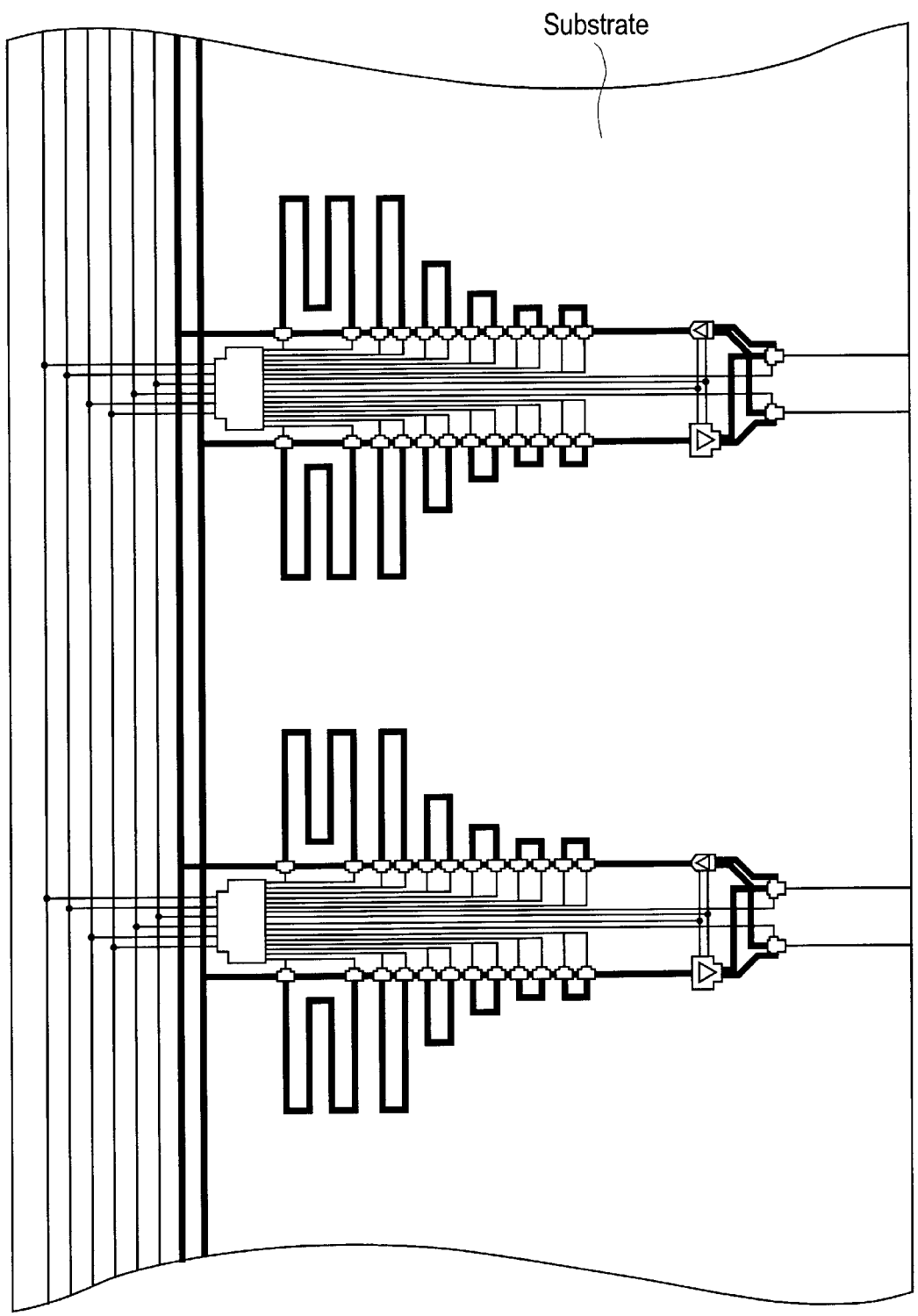
FIG. 10 illustrates top plan view of a circuit for coupling to an external antenna according to one embodiment of the present invention.

In the embodiment of FIG. 4A, antenna elements 412 include a dipole patterned on the substrate 410. It should be noted, however, that the antenna elements 412 as shown are for illustration purposes only, and that many other types of antenna elements may be used. For example, the antenna elements may be protruding from the edge of the substrate. In other embodiments of the present invention, the antenna elements may not be patterned on the substrate. In yet other embodiments, for example, the antenna elements may be external to the substrate containing the active elements. In those embodiments, active elements may be assembled on a substrate using fluidic self-assembly techniques, and active elements are then coupled to stand-alone antenna(s) or stand-alone antenna arrays. As an example, a substrate having electronic devices assembled therein using fluidic-self assembly techniques for coupling to an external antenna is illustrated in FIG. 10.

Figure 4B:
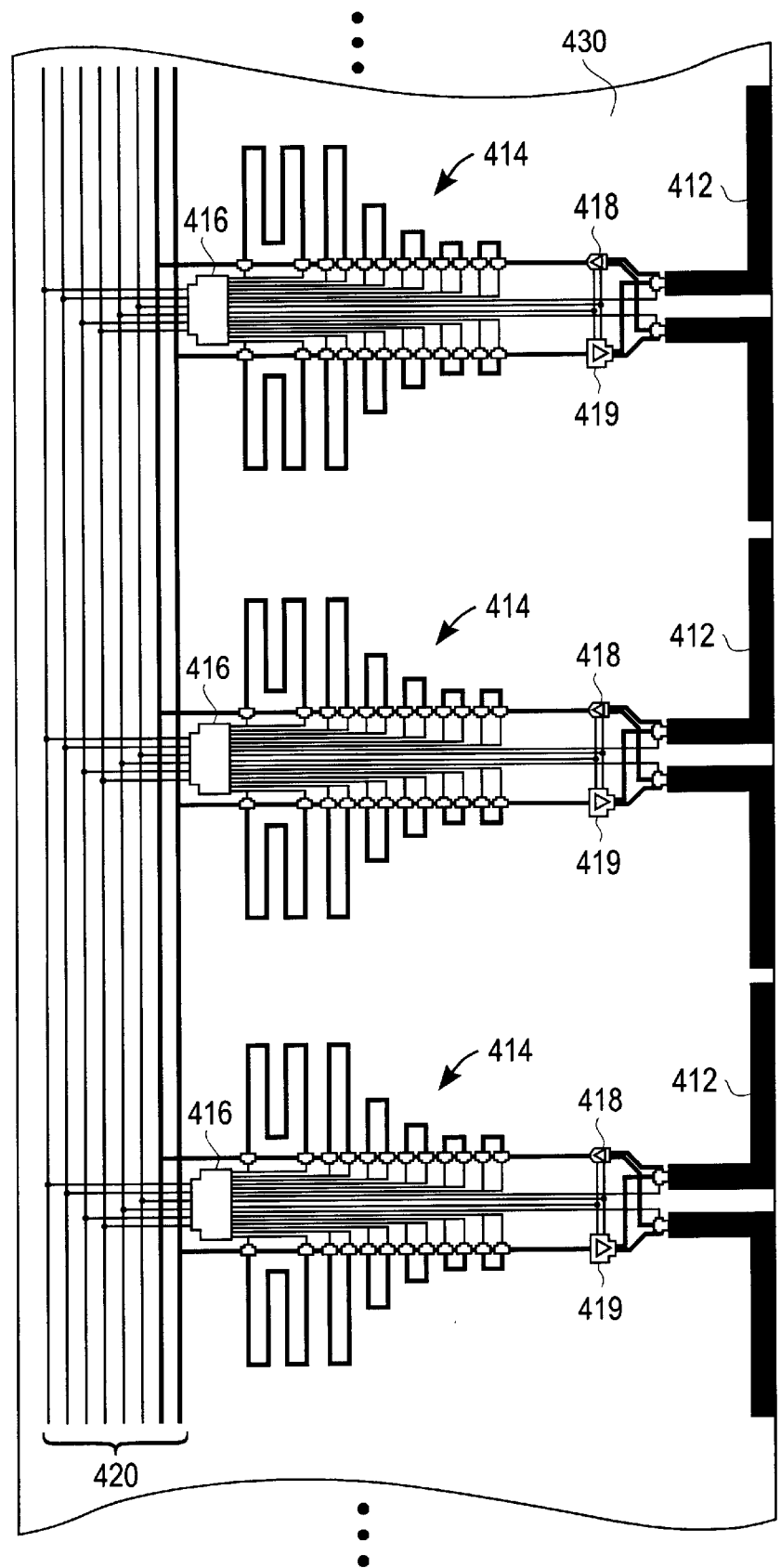
FIG. 4B is a top plan view of a substrate strip containing multiple active antennas according to another embodiment of the present invention.
Figure 5:
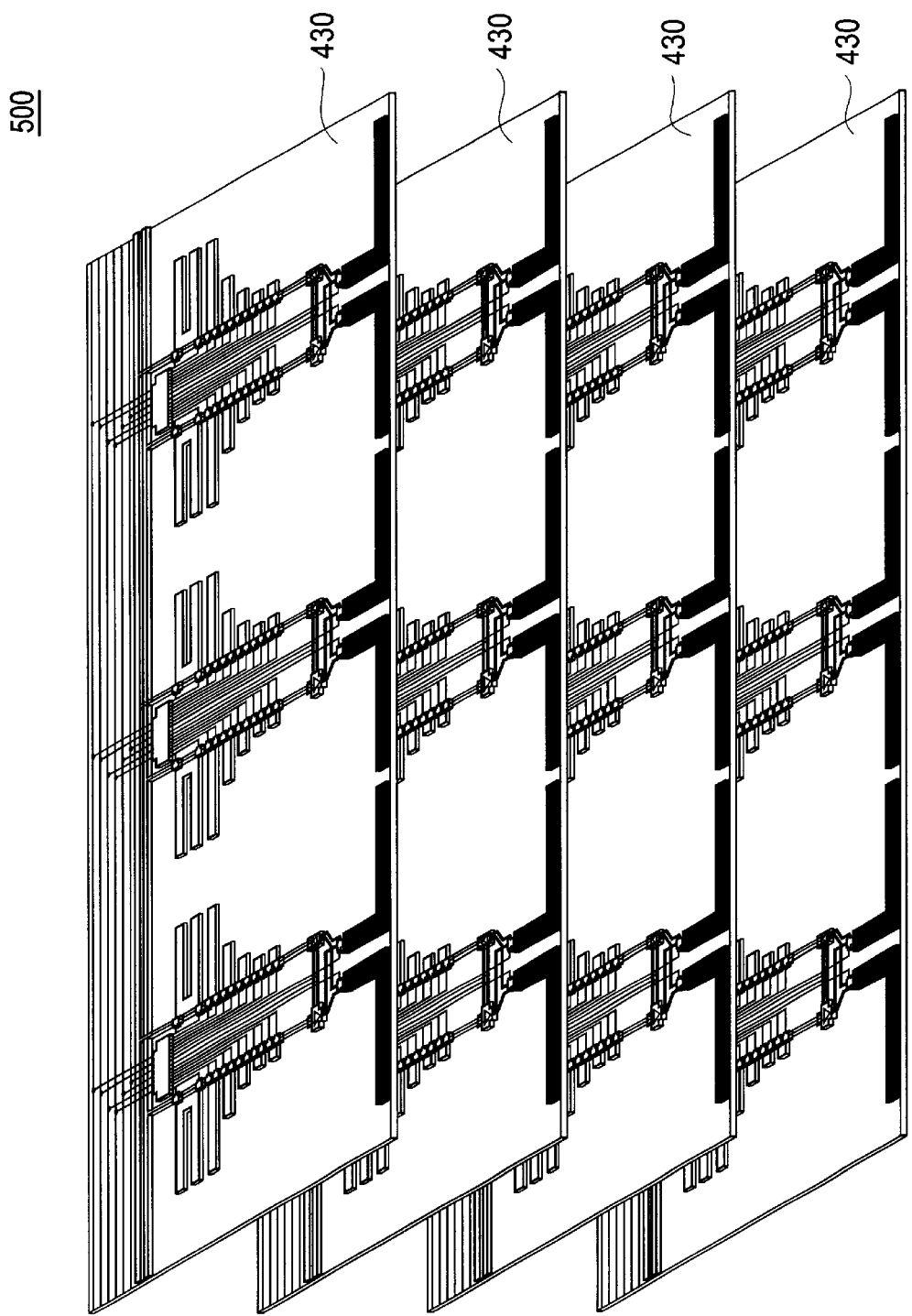
FIG. 5 illustrates a perspective view of an exemplary two dimensional phased-array antenna system formed by stacking multiple substrate strips together.

Multiple active antennas may be fabricated on a single substrate strip. FIG. 4B is a top plan view of a substrate strip 430 containing multiple active antennas 400 according to another embodiment of the present invention. Multiple substrate strips 430 may be stacked together to form a two dimensional phased-array antenna system. A perspective view of an exemplary two dimensional phased-array antenna system 500, including four substrate strips 430 stacked together with spacers (not shown), is illustrated in FIG. 5.

In furtherance of the present invention, the substrate strip 430 is designed to be manufactured in a high efficiency roll-to-roll process. Particularly, for plastic substrates such as nylon acrylic, the active antenna fabrication process may be integrated with a "web" process. For example, a roll of plastic substrates having recessed regions micro-machined thereon may be unrolled and passed through a dispenser of a slurry containing shaped blocks. After the shaped blocks are disposed in the recessed regions, the excess slurry may be removed, and the plastic substrate may be rolled back into a roll for transportation to another location for further processing. The cost of manufacturing a phased-array antenna of the present invention can thus be far below that of conventional phased-array antennas.

Coplanar Waveguides and Micro-Strip Waveguides

For micro-strip type waveguides and micro-strip type signal transmission lines, it may be necessary to process the back side of the substrate and to create vias through the substrate to access the "ground" conductor near every termination. Generally, terminations are not necessary for MEMS switches. But most devices require access to the ground plane. An advantage of co-planar waveguides is that backside processing and via-etching, which may be complex and expensive, can be avoided. Co-planar waveguides, however, have the disadvantage of having slightly poorer power handling capabilities. Table 1 below shows a brief comparison of micro-strip and several co-planar waveguides.

TABLE 1

| Type of Waveguide or Transmission Line | Micro-strip | Co-planar | Co-planar with ground plane | Co-planar Strip |
|---|---|---|---|---|
| Dispersion | High | Low | Medium | Low |
| Crosstalk | High | Low | Low | Medium |
| Design Flexibility | Low | High | High | Low |
| Losses | Low | High | Medium | High |
| Balanced | No | No | No | Yes |
| Power Handling | High | Low | Low | Low |
| Through vias needed | Yes | No | Low Freq. | No |
| Spacing | Large | Small | Small | Medium |

Figure 6A:
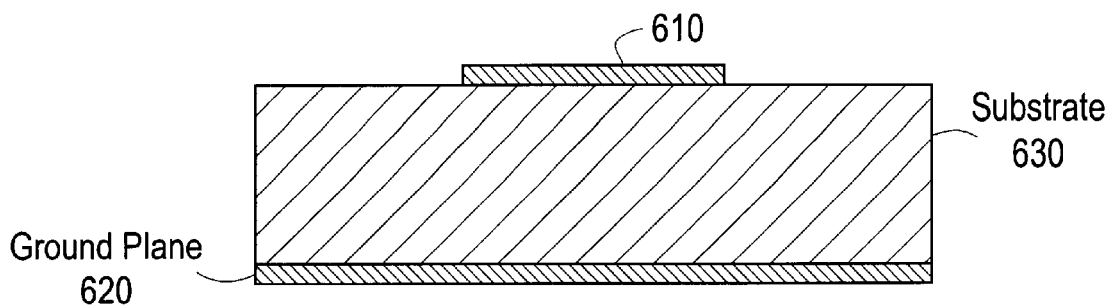
FIG. 6A is a cross-sectional view of a micro-strip waveguide that may be used in embodiments of the present invention.
Figure 6B:
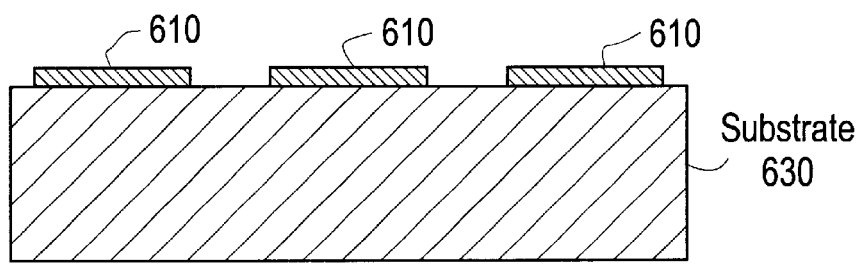
FIG. 6B is a cross-sectional view of a co-planar waveguide that may be used in embodiments of the present invention.
Figure 6C:
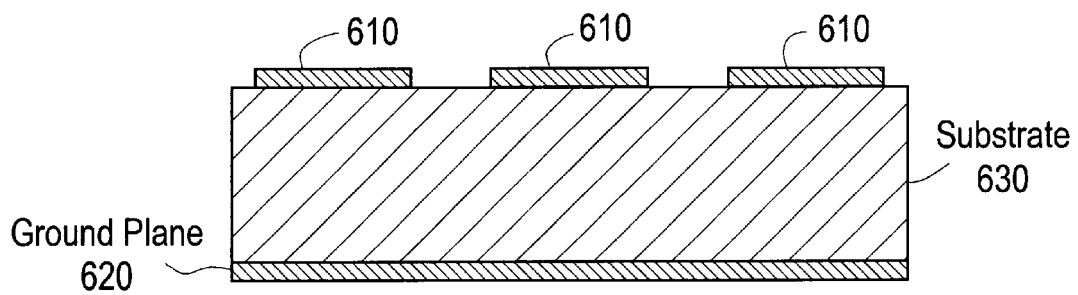
FIG. 6C is a cross-sectional view of a co-planar waveguide that may be used in embodiments of the present invention.
Figure 6D:
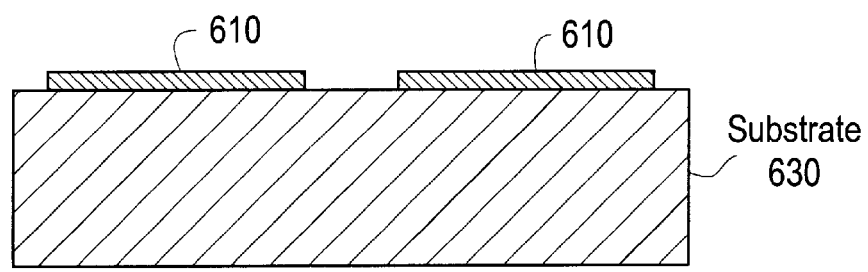
FIG. 6D is a cross sectional view of a co-planar strip waveguide that may be used in embodiments of the present invention.

FIG. 6A is a cross-sectional view of a micro-strip waveguide/transmission line. As shown, a conductive strip 610 is separated from the ground plane 620 by a substrate 630. FIG. 6B is a cross-sectional view of a co-planar waveguide/transmission line having three conductive strips 610. FIG. 6C is a cross-sectional view of a co-planar waveguide/transmission line with three conductive strips 610 separated from a ground plane 620 by the substrate 630. FIG. 6D is a cross sectional view of a co-planar strip waveguide/transmission line having two conductive strips 610. These different waveguide/transmission line configurations may be used in any embodiments of the present invention.

A balanced transmission line is one where the TEM mode occurs with the differential voltage appearing symmetrically as a positive voltage on one conductor and a negative voltage occurring on another conductor. An unbalanced transmission line usually has the majority or even all of the voltage occurring across the waveguide single-endedly, with only a small excursion on the "ground" conductors. Balanced transmission lines, such as co-planar strips of FIG. 6D, are driven with differential balanced outputs, and are received by differential inputs. Unbalanced transmission lines are driven with single-ended outputs, and can be received be single-ended inputs.

Compared to normal micro-strip structures, either co-planar strips or co-planar transmission lines may have less dielectric loss. The reason is that about 50% of the field is in the air and dielectric loss is less significant. For micro-strips, about 60%-95% of the field will be in the substrate and the dielectric loss is higher. For metallic loss, co-planar waveguides normally has less loss because its metal path is normally wider. For co-planar strips, the metallic loss depends upon how wide the conducting strips are.

When co-planar waveguides are used in active antennas or phased-array antennas of the present invention, the co-planar waveguides can be operated one of multiple TEM modes, including: (1)–11 –1; (2)–101; and, (3)–1 –11. Normally, the first fundamental TEM mode (–11 –1) is used. However, any discontinuities such as a bend can induce the other fundamental modes. Crossovers connecting the outer conductors can suppress the higher order modes.

Figure 7:
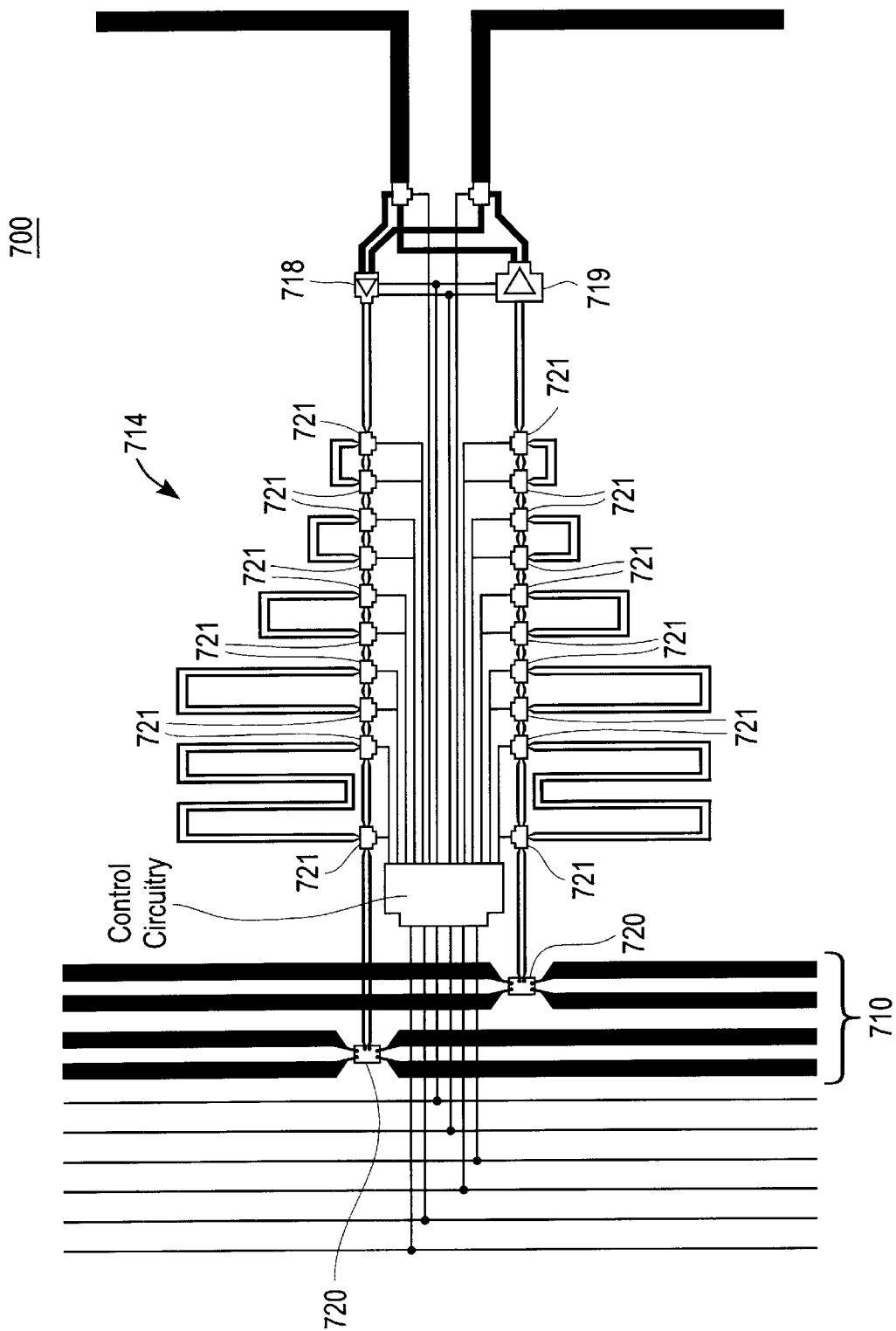
FIG. 7 is a top plan view of an active antenna using co-planar strip waveguides according to another embodiment of the present invention.

According to one embodiment of the present invention, an active antenna 700 that uses co-planar strip waveguides and transmission lines is illustrated in FIG. 7. As shown the meandering waveguides of the phase-shifter 714 include co-planar strips, and the MEMS switches 721 are configured for coupling to co-planar strips. In addition, high-performance amplifiers 718, 719 are also configured for receiving and transmitting signals via the co-planar strips.

The signal bus 710 of the active antenna 700 also includes co-planar strips. In addition, the signal bus 710 includes active T-bar circuits 720 for coupling the signal bus 710 to the phase shifter 714. According to the present embodiment, by using active T-bar circuits 720, signal deterioration can be avoided when multiple active antennas are coupled to the signal bus 710. It should be noted that, in the embodiment as illustrated in FIG. 7, signals and power are carried on separate transmission lines. In another embodiment of the present invention, DC power and ground and AC signals may be superimposed and carried by a same transmission line.

Figure 8:
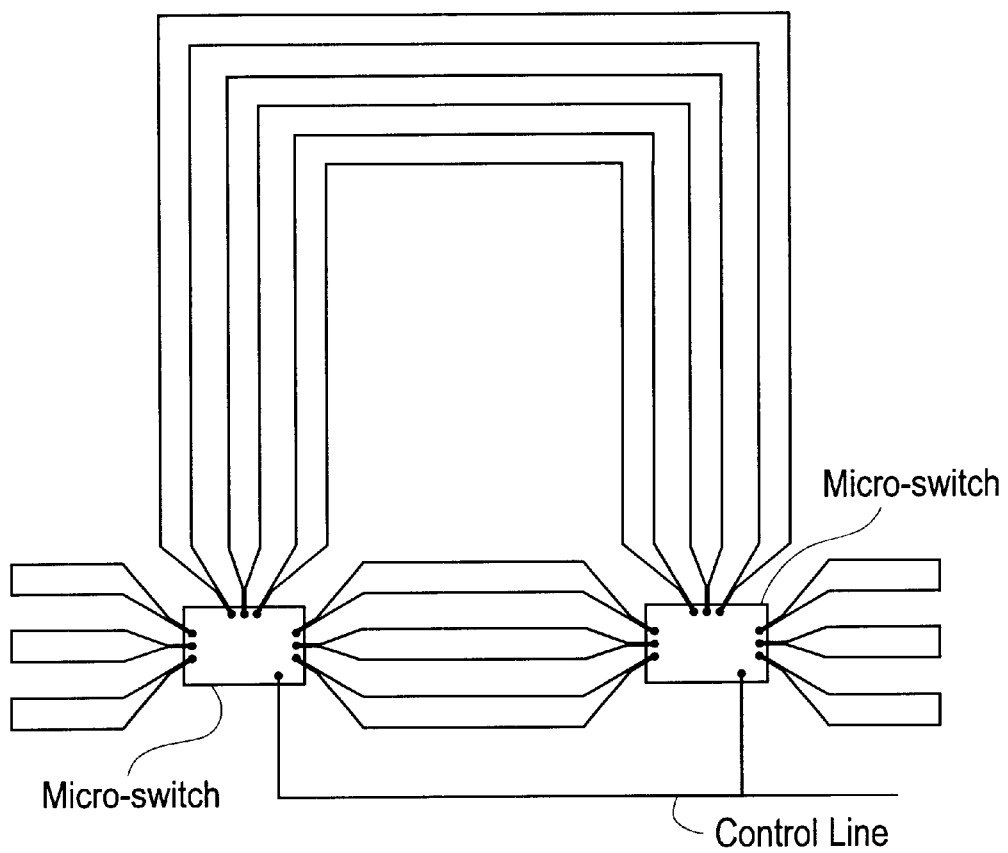
FIG. 8 illustrates a portion of a phase shifter with 3-strip co-planar waveguides in accordance with another embodiment of the present invention.

According to another embodiment of the present invention, waveguides and transmission lines may be implemented with co-planar waveguides as depicted in FIGS. 6B or 6C. A portion of a phase shifter having such co-planar waveguides that may be implemented as part of an embodiment of the present invention is illustrated in FIG. 8. A signal bus having co-planar transmission lines that may be implemented as part of an embodiment of the present invention is illustrated in FIG. 9.

Figure 9:
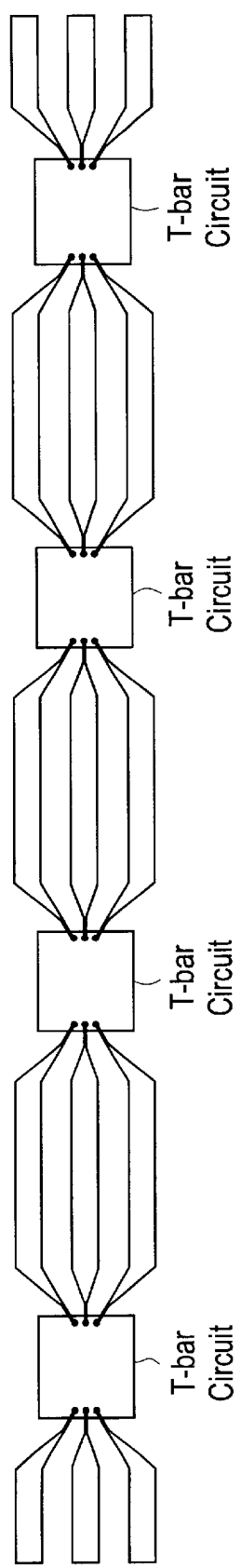
FIG. 9 illustrates a portion of a signal bus with 3-strip co-planar transmission lines in accordance with yet another embodiment of the present invention.

The transmission line shown in FIG. 9 forms a bus structure with a high impedance connection from a shaped block to the transmission line, allowing signals to propagate to multiple destinations without substantial reflection, loss or distortions. This forms a high frequency bus structure. Also note that the conductors can carry low frequency signals or DC signals such as power and ground in addition to, and at the same time as, high frequency signals carried by the transmission line structure.

The present invention, fluidic self-assembly of active antennas, has thus been disclosed. The foregoing description, for purposes of explanation, used specific nomenclature to provide a thorough understanding of the invention. However, it will be apparent to one skilled in the art that the specific details are not required in order to practice the invention. In other instances, well known devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A waveguide structure, comprising:
   a substrate comprising at least one recessed region;
   a first transmission path and a second transmission path, the first transmission path having a first predetermined time delay and the second transmission path having a second predetermined time delay;
   a shaped block disposed in the at least one recessed region, the shaped block comprising a device coupled to the first transmission path and the second transmission path, the device operable for adjusting time delay of the waveguide structure by selecting one of the first transmission path and the second transmission path.

2. The waveguide structure of claim 1, wherein the substrate comprises a non-semiconductor material.

3. The waveguide structure of claim 2, wherein the non-conductive material comprises plastic.

4. The waveguide structure of claim 2, wherein the shaped block comprises semiconductor material.

5. The waveguide structure of claim 1, wherein the device comprises a micro-electromechanical switch.

6. The waveguide structure of claim 1, wherein the device comprises a transistor-based switch.

7. The waveguide structure of claim 1, wherein the at least one recessed region comprises a profile substantially complementary to the shaped block such that the shaped block and the substrate form a substantially planar surface.

8. The waveguide structure of claim 7, wherein the shaped block comprises a substantially trapezoidal profile.

9. The waveguide structure of claim 7, wherein the shaped block comprises an asymmetric profile.

10. A circuit for coupling to an antenna, comprising:
    a substrate comprising at least one recessed region;
    a variable waveguide structure coupled to receive signals from a signal source, the variable waveguide structure for phase-shifting the signals;
    a shaped block disposed in the at least one recessed region, the shaped block comprising an active circuit coupled to the variable waveguide structure for receiving time-delayed signals for driving the antenna and for amplifying the time-delayed signals.

11. The circuit of claim 10, wherein the substrate comprises a non-semiconductor material.

12. The circuit of claim 11, wherein the shaped block comprises a semiconductor material.

13. The circuit of claim 11, wherein the shaped block comprises silicon.

14. The circuit of claim 11, wherein the shaped block comprises III–IV semiconductor material.

15. The circuit of claim 11, wherein the shaped block comprises gallium arsenide (GaAs).

16. The circuit of claim 10, wherein the substrate comprises plastic.

17. The circuit of claim 10, wherein the at least one recessed region comprises a shape substantially complementary to the shaped block such that the shaped block and the substrate form a substantially planar surface.

18. The circuit of claim 17, wherein the shaped block comprises a substantially trapezoidal profile.

19. The circuit of claim 17, wherein the shaped block comprises an asymmetric profile.

20. The circuit of claim 17, wherein the variable waveguide structure comprises metalized lines disposed on the substantially planar surface.

21. A circuit for coupling to an antenna, comprising:
    a substrate comprising at least one recessed region;
    a shaped block disposed in the at least one recessed region, the shaped block comprising an active circuit input for coupling to a signal source and for receiving signals from the signal source, the active circuit for amplifying the signals; and
    a variable waveguide structure for phase-shifting amplified signals generated by the active circuit.

22. The circuit of claim 21, wherein the substrate comprises a non-semiconductor material.

23. The circuit of claim 22, wherein the shaped block comprises a semiconductor material.

24. The circuit of claim 22, wherein the shaped block comprises silicon.

25. The circuit of claim 22, wherein the shaped block comprises III–IV semiconductor material.

26. The circuit of claim 22, wherein the shaped block comprises indium phosphate (InP).

27. The circuit of claim 21, wherein the substrate comprises plastic.

28. The circuit of claim 21, wherein the at least one recessed region comprises a shape substantially complementary to the shaped block such that the shaped block and the substrate form a substantially planar surface when the shaped block is disposed in the at least one recessed region.

29. The circuit of claim 28, wherein the shaped block comprises a substantially trapezoidal profile.

30. The circuit of claim 28, wherein the shaped block comprises an asymmetric profile.

31. The circuit of claim 28, wherein the variable waveguide structure comprises metalized lines disposed on the substantially planar surface.

32. A circuit for coupling to an antenna, comprising:
a non-semiconductor substrate comprising a plurality of recessed regions;
a variable waveguide structure coupled to receive signals from a signal source, the variable waveguide structure for phase-shifting the signals;
a first shaped block disposed in a first one of the recessed regions, the first shaped block comprising a control circuit coupled to the variable waveguide structure and for adjusting a time delay of the variable waveguide structure;
a second shaped block disposed in a second one of the recessed regions, the second shaped block comprising an active circuit coupled to the variable waveguide structure for receiving phase-shifted signals and for providing amplified phase-shifted signals to the antenna.

33. The circuit of claim 32, wherein the first shaped block comprises a first semiconductor material and wherein the second shaped block comprises a second semiconductor material.

34. The circuit of claim 33, wherein the first semiconductor material comprises silicon and wherein the second semiconductor material comprises gallium arsenide (GaAs).

35. The circuit of claim 32, wherein the non-semiconductor substrate comprises plastic.

36. The circuit of claim 32, wherein the non-semiconductor substrate, the first shaped block and the second shaped block form a substantially planar surface.

37. The circuit of claim 36, wherein the variable waveguide structure comprises metalized lines disposed on the substantially planar surface.

38. The circuit of claim 32, wherein the first recessed region comprises a first profile substantially complementary to the first shaped block, and wherein the second recessed region comprises a second profile substantially complementary to the second shaped block.

39. The circuit of claim 32, wherein the first shaped block comprises a first substantially trapezoidal shape and wherein the second shaped block comprises a second substantially trapezoidal shape.

40. The circuit of claim 32, wherein the first shaped block comprises a first asymmetric profile and wherein the second shaped block comprises a second asymmetric profile.

41. A circuit for coupling to an antenna, comprising:
a non-semiconductor substrate comprising a plurality of recessed regions;
a first shaped block disposed in a first one of the recessed regions, the first shaped block comprising an active circuit coupled to receive signals from the antenna and to generate amplified signals;
a variable waveguide structure coupled to receive the amplified signals from the active circuit, the variable waveguide structure for generating phased-shifted signals from the amplified signals;
a second shaped block disposed in a second one of the recessed regions, the second shaped block comprising a control circuit coupled to the variable waveguide structure and for adjusting a time delay of the variable waveguide structure.

42. The circuit of claim 41, wherein the first shaped block comprises a first semiconductor material and wherein the second shaped block comprises a second semiconductor material.

43. The circuit of claim 42, wherein the first semiconductor material comprises silicon and wherein the second semiconductor material comprises gallium arsenide (GaAs).

44. The circuit of claim 41, wherein the non-semiconductor substrate comprises plastic.

45. The circuit of claim 41, wherein the non-semiconductor substrate, the first shaped block and the second shaped block form a substantially planar surface.

46. The circuit of claim 45, wherein the variable waveguide structure comprises metalized lines disposed on the substantially planar surface.

47. The circuit of claim 41, wherein the first recessed region comprises a first profile substantially complementary to the first shaped block, and wherein the second recessed region comprises a second profile substantially complementary to the second shaped block.

48. The circuit of claim 41, wherein the first shaped block comprises a first substantially trapezoidal shape and wherein the second shaped block comprises a second substantially trapezoidal shape.

49. The circuit of claim 41, wherein the first shaped block comprises a first asymmetric profile and wherein the second shaped block comprises a second asymmetric profile.

50. An active antenna, comprising:
a substrate comprising at least one recessed region;
an antenna element coupled to the substrate;
a tapered block disposed in the at least one recessed region, the tapered block comprising a device coupled to the antenna element;
wherein a substrate and the tapered block form a substantially planar surface; and
a waveguide structure having metalized lines disposed on the substantially planar surface.

51. The active antenna of claim 50, wherein the substrate comprises a non-semiconductor material and wherein the tapered block comprises a semiconductor material.

52. The active antenna of claim 51, wherein the non-semiconductor material comprises plastic.

53. The active antenna of claim 50, wherein the device comprises a control circuit for adjusting a time delay of the waveguide structure.

54. The active antenna of claim 50, wherein the device comprises an amplifier circuit.

55. The active antenna of claim 50, wherein the recessed region comprises a profile substantially complementary to the tapered block.

56. The active antenna of claim 50, wherein the at least one recessed region has at least one beveled edge.

57. An active antenna, comprising:
a substrate comprising at least one recessed region with at least one beveled edge;
an antenna element coupled to the substrate;
a shaped block disposed in the at least one recessed region, the shaped block comprising a device coupled to the antenna element, wherein the substrate and the shaped block form a substantially planar surface; and a waveguide structure having metalized lines disposed on the substantially planar surface.

58. The active antenna of claim 57, wherein the substrate comprises a non-semiconductor material and wherein the shaped block comprises a semiconductor material.

59. The active antenna of claim 58, wherein the non-semiconductor material comprises plastic.

60. The active antenna of claim 57, wherein the device comprises a control circuit for adjusting a time delay of the waveguide structure.

61. The active antenna of claim 57, wherein the device comprises an amplifier circuit.

62. The active antenna of claim 57, wherein the recessed region comprises a profile substantially complementary to the shaped block.

63. A phased-array antenna, comprising:

a substrate comprising a plurality of recessed regions;

a plurality of antenna elements disposed on the substrate;

a plurality of variable time delay circuits coupled to the antenna elements and coupled to a signal bus, the variable time delay circuits operable for receiving signals from the signal bus and generating phase-shifted signals therefrom;

a plurality of first shaped blocks disposed in first respective ones of the plurality of recessed regions, the first shaped blocks comprising first electronic circuits coupled to the variable time delay circuits for receiving the phase-shifted signals, and for modifying the phase-shifted signals to be provided to the antenna elements.

64. The phased-array antenna of claim 63, wherein the substrate comprises non-semiconductor material.

65. The phased-array antenna of claim 63, wherein the substrate comprises plastic.

66. The phased-array antenna of claim 63, wherein the substrate comprises non-plastic dielectric material.

67. The phased-array antenna of claim 63, wherein the first electronic circuits comprise summing circuits for selectively summing the phase-shifted signals.

68. The phased-array antenna of claim 63, wherein the first electronic circuits comprise transmitter amplifiers for amplifying the phase-shifted signals.

69. The phased-array antenna of claim 63, further comprising second shaped blocks disposed in second respective ones of the plurality of recessed regions, wherein the first shaped blocks, the second shaped blocks and the substrate form a substantially planar surface.

70. The phased-array antenna of claim 60, wherein the second shaped blocks comprise second electronic circuits coupled to adjust time delays of the variable time delay circuits.

71. The phased-array antenna of claim 60, wherein the second shaped blocks comprise second electronic circuits for receiving signals from the antenna elements and for generating amplified signals therefrom.

72. The phased-array antenna of claim 60, wherein the second shaped blocks comprise micro-switches coupled to select signal transmission paths of the variable time delay circuits.

73. The phased-array antenna of claim 63, wherein the substrate comprises non-semiconductor material.

74. The phased-array antenna of claim 73, wherein the first shaped blocks comprise a semiconductor material.

* * * * *